United States Patent
Gordon et al.

(10) Patent No.: US 6,569,241 B2
(45) Date of Patent: *May 27, 2003

(54) SUBSTRATE SPINNING APPARATUS

(75) Inventors: Brian F. Gordon, Boise, ID (US); Paul D. Shirley, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/160,655

(22) Filed: May 30, 2002

(65) Prior Publication Data

US 2002/0148404 A1 Oct. 17, 2002

Related U.S. Application Data

(63) Continuation of application No. 09/624,900, filed on Jul. 25, 2000, now Pat. No. 6,398,868, which is a division of application No. 09/410,969, filed on Oct. 4, 1999, now Pat. No. 6,232,247, which is a continuation-in-part of application No. 09/388,855, filed on Sep. 1, 1999, now abandoned.

(51) Int. Cl.[7] ............................ B05C 11/08; B05C 13/02
(52) U.S. Cl. ........................ 118/52; 118/56; 118/319; 118/320; 118/500; 118/503; 118/730
(58) Field of Search ................ 118/52, 56, 319, 118/320, 500, 503, 730; 427/240; 269/21, 254 R, 903

(56) References Cited

U.S. PATENT DOCUMENTS

| | | | |
|---|---|---|---|
| 3,870,014 A | 3/1975 | Buck | 118/52 |
| 4,031,852 A | 6/1977 | Clarke et al. | 118/52 |
| 4,875,434 A | 10/1989 | Maejima et al. | 118/52 |
| 5,192,087 A | * 3/1993 | Kawashima et al. | 118/503 |
| 5,260,174 A | 11/1993 | Nakazawa et al. | 118/52 |
| 5,421,056 A | * 6/1995 | Tateyama et al. | 134/153 |
| 5,449,578 A | 9/1995 | Man | 430/5 |
| 5,595,783 A | 1/1997 | Cook | 427/240 |
| 5,601,645 A | 2/1997 | Nonomura et al. | 118/52 |
| 5,658,615 A | 8/1997 | Hasebe et al. | 427/240 |
| 5,763,329 A | 6/1998 | Kariya | 438/780 |
| 5,985,363 A | 11/1999 | Shiau et al. | 427/240 |
| 6,174,011 B1 | * 1/2001 | Keigler | 294/1.1 |
| 6,398,868 B1 | * 6/2002 | Gordon et al. | 118/52 |

* cited by examiner

Primary Examiner—Laura Edwards
(74) Attorney, Agent, or Firm—Wells St. John P.S.

(57) ABSTRACT

In one aspect, the invention includes a method of improving uniformity of liquid deposition when a liquid is spin-coated over a non-circular substrate. The substrate is retained on a platform and spun. The circular platform includes a plurality of shaping members pivotally connected to the platform. The plurality of shaping members are biased by spinning the platform to form a platform surface with a circular periphery. In another aspect, the invention includes a substrate coating apparatus. Such apparatus comprises a non-circular substrate support configured to support a substrate with a planar surface and non-circular periphery. The apparatus further comprises a motor configured to spin the substrate support. A plurality of shaping members are pivotally connected with the substrate support and each shaping member has a curved outer side surface. Gravity biases the shaping members downward until an angular velocity of the substrate support provides a force to bias each shaping member upward adjacent the substrate to establish a circular surface.

20 Claims, 4 Drawing Sheets

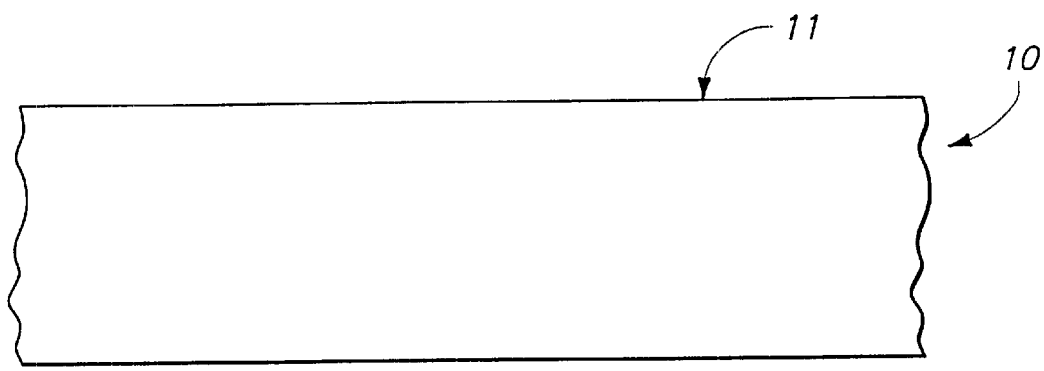
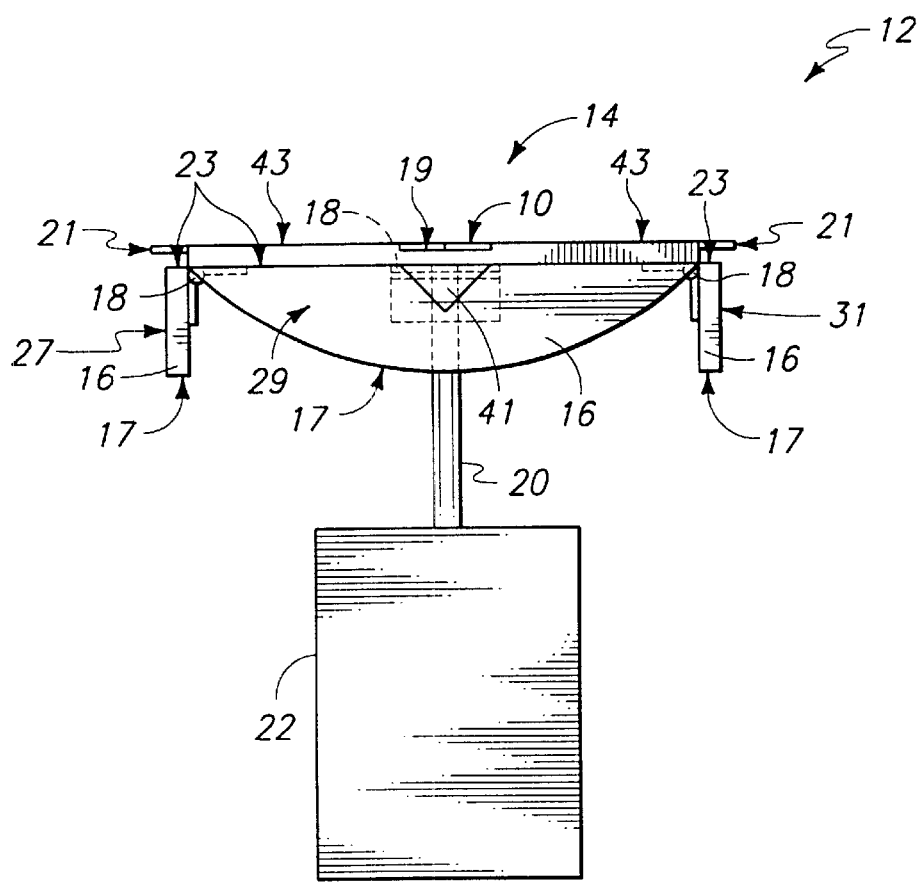

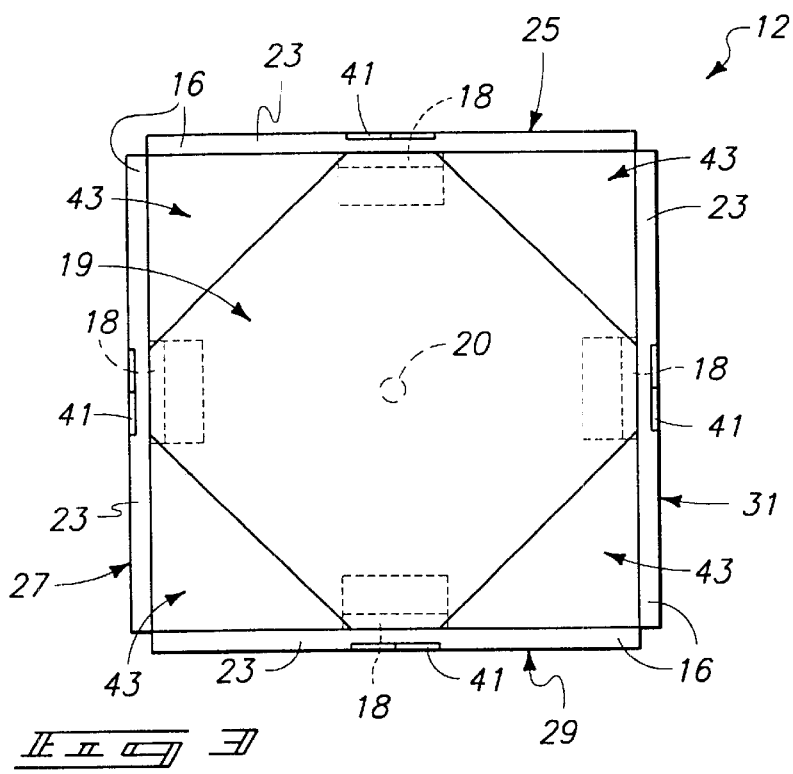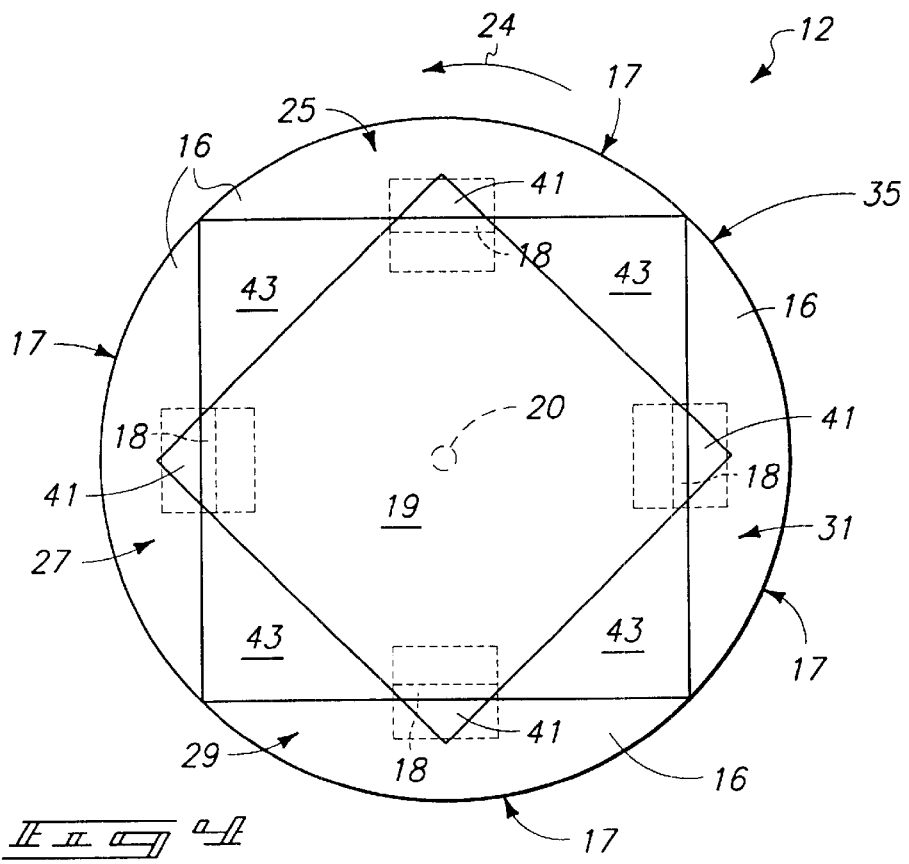

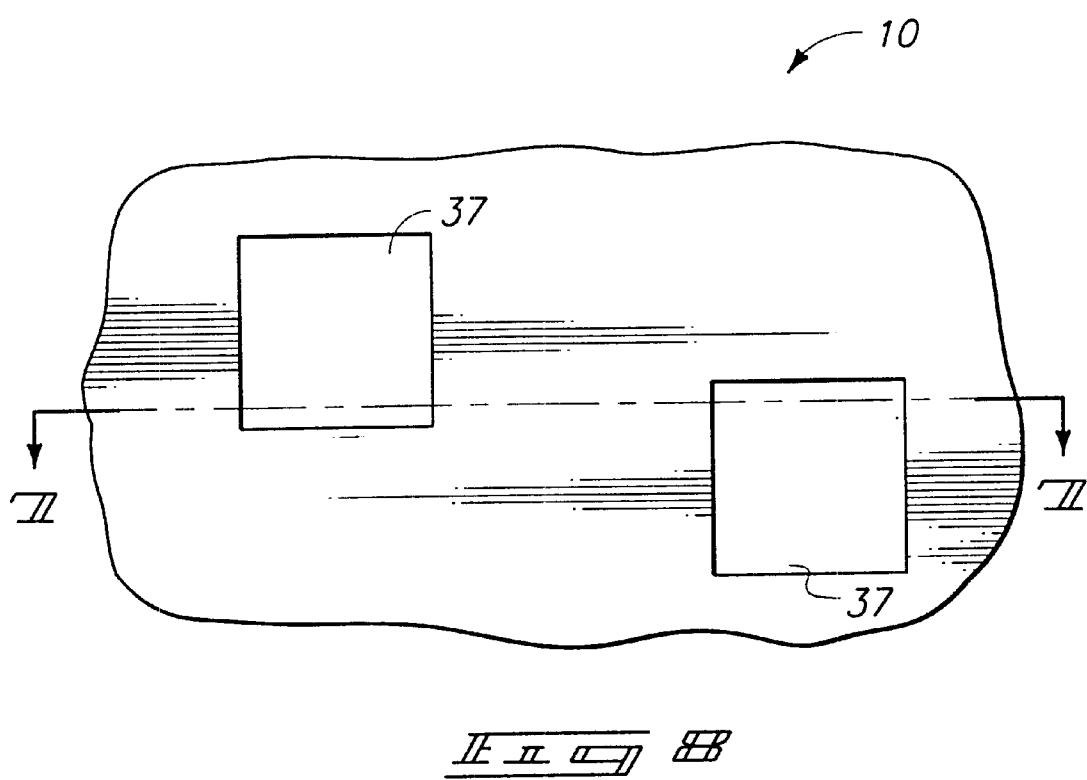

SUBSTRATE SPINNING APPARATUS

RELATED PATENT DATA

This patent application is a Continuation Application of U.S. patent application Ser. No. 09/624,900, filed Jul. 25, 2000, entitled "Substrate Coating Apparatus and Semiconductor Processing Method of Improving Uniformity of Liquid Deposition," naming Brian F. Gordon and Paul D. Shirley as inventors, now U.S. Pat. No. 6,398,868 B1, which is a Divisional Application of U.S. patent application Ser. No. 09/410,969, filed Oct. 4, 1999, now U.S. Pat. No. 6,232,247 B1, which is a Continuation-in-part of U.S. patent application Ser. No. 09/388,855, filed Sep. 1, 1999, now abandoned, the disclosures of which are incorporated by reference.

TECHNICAL FIELD

This invention relates to methods of improving uniformity of liquid deposition and to substrate coating. The invention also relates to substrate coating apparatuses.

BACKGROUND OF THE INVENTION

In some applications, it can be desirable to form a uniform coating over a non-circular substrate. For instance, it can be desirable to coat a uniform layer of photoresist on a square or rectangular shaped radiation patterning tool, such as, for example, a reticle or mask.

One method of coating a radiation patterning tool is to spin the radiation patterning tool while flowing a liquid thereover. The liquid is commonly applied to the center of the radiation patterning tool and concentrically spreads outward in radial directions due to the action of centrifugal forces during spinning. A difficulty in utilizing the above-described spin coating method for applying liquid over non-circular shaped substrates (such as rectangular substrates) is that the non-circular periphery of the substrates can cause turbulent airflow during spinning that affect the uniform flow of the liquid. The turbulent airflow exerts undesirable aerodynamic forces to the liquid, causing non-uniform flow of the liquid on the substrate. Such can cause the thickness of the liquid to vary across the substrate.

In an exemplary process wherein a liquid photoresist is spun over a non-circular radiation patterning tool, the uneven distribution of the liquid can diminish the accuracy with which the photoresist is subsequently patterned. Such diminished accuracy of photoresist patterning can in turn lead to diminished accuracy in subsequent patterning of the radiation patterning tool. It would, therefore, be desirable to develop improved methods for spin coating non-circular substrates.

SUMMARY OF THE INVENTION

In one aspect, the invention includes a method of improving uniformity of liquid deposition when a liquid is spin-coated over a non-circular substrate. The substrate is retained on a platform and spun. The circular platform includes a plurality of shaping members pivotally connected to the platform. The plurality of shaping members are biased by spinning the platform to form a platform surface with a circular periphery.

In another aspect, the invention includes a method of coating a non-circular substrate. The substrate is secured to a support and spun. A plurality of shaping members are positioned proximate the non-circular substrate to form a circular surface. While spinning, the non-circular substrate is coated over with a photoresist material, and then the photoresist is patterned. After patterning the photoresist, the non-circular substrate is etched to form a radiation patterning tool with at least one opening.

In yet another aspect, the invention includes a substrate coating apparatus. Such apparatus comprises a non-circular substrate support configured to support a substrate with a planar surface and non-circular periphery. The apparatus further comprises a motor configured to spin the substrate support. A plurality of shaping members are pivotally connected with the substrate support and each shaping member has a curved outer side surface. Gravity biases the shaping members downward until an angular velocity of the substrate support provides a force to bias each shaping member upward adjacent the substrate to establish a circular surface.

BRIEF DESCRIPTION OF THE DRAWINGS

Preferred embodiments of the invention are described below with reference to the following accompanying drawings.

FIG. 1 is a fragmentary side view of a substrate at one processing step in accordance with one embodiment of the invention.

FIG. 2 is a elevational side view of a substrate coating apparatus in accordance with one embodiment of the invention, and shown with the FIG. 1 substrate at a processing step subsequent to that shown in FIG. 1.

FIG. 3 is a top plan view of the substrate coating apparatus of FIG. 2 with the substrate removed.

FIG. 4 is a view of the substrate coating apparatus of FIG. 3 at a processing step subsequent to that shown in FIG. 3.

FIG. 8 is a fragmentary top plan view of the FIG. 1 substrate shown in FIG. 7.

DETAILED DESCRIPTION OF THE PREFERRED EMBODIMENTS

Figure 5:
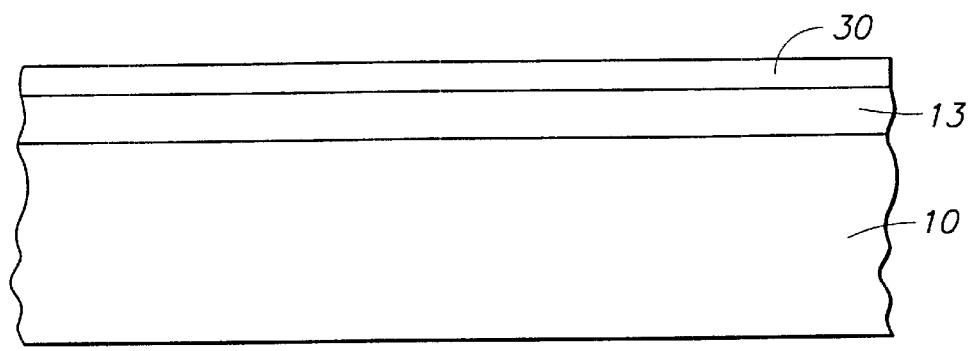
FIG. 5 is a view of the FIG. 1 substrate at a processing step subsequent to that shown in FIG. 2.

This disclosure of the invention is submitted in furtherance of the constitutional purposes of the U.S. Patent Laws "to promote the Progress of Science and useful Arts" (Article 1, Section 8).

To aid in interpretation of the claims that follow, the terms "semiconductive substrate" and "semiconductor substrate" are defined to mean any construction comprising semiconductive material including, but not limited to, bulk semiconductor materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The term "radiation patterning tool" is defined to mean any construction used to create radiation patterns for photolithography processing of semiconductive materials and includes, for example, reticles and masks.

FIGS. 1–8 illustrate a method of improving uniformity of liquid deposition when a liquid is spin-coated over a non-circular substrate. Referring to FIG. 1, a substrate fragment in process is indicated generally by reference numeral 10.

The substrate can be, for example, a noncircular shaped material having a planar surface 11. An exemplary material for the substrate is quartz, as could be utilized for fabrication of a reticle or mask.

Referring to FIG. 2, one embodiment of a substrate coating apparatus encompassed by the present invention is indicated generally by reference numeral 12. The substrate coating apparatus 12 comprises a shaft 20 and a motor 22 configured to spin a substrate support 14. The substrate support 14 is configured to secure and support substrate 10 to a support upper surface 19 adjacent elevated surfaces 43. Elevated surfaces 43 are elevationally above support upper surface 19. In this FIG., substrate 10 is shown as a complete substrate (not a substrate fragment as in FIG. 1), and therefore, edges 21 of substrate 10 are shown. Substrate coating apparatus 12 can be configured to provide a vacuum proximate the support upper surface 19 to secure substrate 10. A plurality of shaping members 16 are pivotally connected to substrate support 14 by, for example, hinges 18 (shown in phantom to indicate they are beneath support 19).

In the shown embodiment, support upper surface 19 of substrate support 14 has smaller cross-sectional dimensions than substrate 10 to allow edges 21 of substrate 10 to extend beyond support upper surface 19. Accordingly, a grasping apparatus, for example, a pincer-shaped tool (not shown), can grasp substrate 10 proximate edges 21 to position substrate 10 on and off the substrate coating apparatus 12. Alternatively, a vacuum wand or other suction apparatus (not shown) may be used to place and remove substrate 10. Each shaping member 16 comprises upper surfaces 25 (shown in FIGS. 3–4), 27, 29 and 31, respectively, a curved outer side surface 17 and a straight inner side surface 23. Additionally, each upper surface of shaping members 16 defines a lower surface 41 elevationally below the upper surfaces (shown only within upper surface 29 in this FIG.).

Referring to FIG. 3, shaping members 16 are initially biased downward by gravity with the curved outer side surfaces 17 directed downward. The shaping members 16 are hinged to a bottom surface of substrate support 14. Also attached to the bottom surface of substrate support 14 is shaft 20.

Referring to FIG. 4, shaft 20 transfers the rotational energy of motor 22 to spin substrate support 14 in direction 24 until an angular velocity provides a force to bias upwardly each shaping member 16 proximate substrate 10 and thereby establish a circular surface 35. Surface 35 comprises upper surfaces 25, 27, 29 and 31 of shaping members 16 and elevated surfaces 43. The lower surfaces 41 are coplanar with support upper surface 19 and together establish a square receiving area when shaping members 16 are positioned upward.

In one aspect of the invention, a square substrate (not shown) is secured to support upper surface 19. The square substrate has a thickness equal to the elevational thickness of surface 35 above support upper surface 19. When shaping members 16 are biased upward, the square substrate is resting in the square receiving area of substrate support 14 and a top surface of the square substrate is coplanar with surface 35. Accordingly, the square substrate and substrate support establish one planar surface. In one particular aspect of the invention, the square substrate comprises a reticle, and in another aspect a mask.

Alternative methods of positioning shaping members 16 to establish circular surface 35 could be utilized. Instead of using the spinning action of substrate support 14 to bias the shaping members 16 upward, shaping members 16 could be releasably locked into the upward position before spinning by, for example, snapping shaping members 16 into place with substrate support 14. In an additional alternative method, the shaping members 16 could be continually biased upward with, for example, a spring. In this latter example, the shaping members 16 can be forced to pivot downward by applying a force to surfaces 25, 27, 29 and/or 31. The shaping members 16 spring back into place when released.

An exemplary use of the substrate coating apparatus 12 is to pattern a radiation patterning tool comprising a quartz substrate. Referring to FIG. 5, substrate 10 of FIG. 1 is shown as quartz substrate 10 at a processing step subsequent to that shown in FIG. 2 (substrate coating apparatus 12 is no longer shown). Substrate 10 is shown after a chrome containing layer 13 and a photoresist material 30 are coated uniformly thereon.

Figure 6:
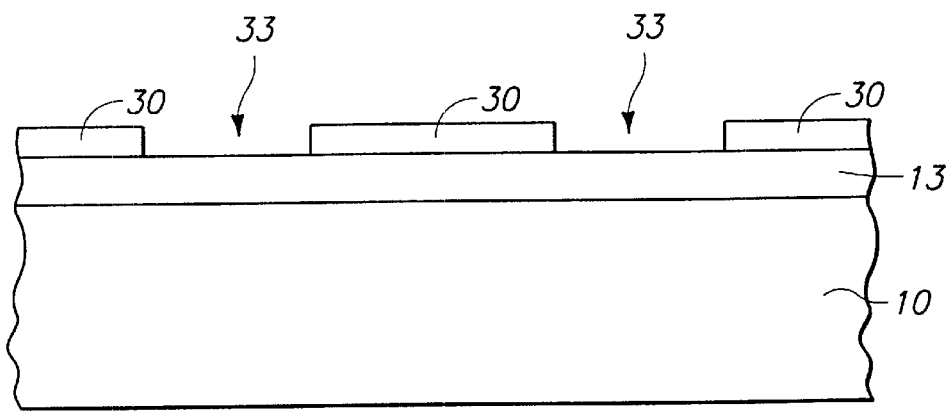
FIG. 6 is a view of the FIG. 1 substrate at a processing step subsequent to that shown in FIG. 5.

Referring to FIG. 6, photoresist material 30 is converted to a patterned mask. Such can be accomplished, for example, by exposing portions of photoresist material 30 to energy, such as, for example, an electron beam, while leaving other portions unexposed. Subsequently, either the exposed or unexposed portions are removed with a solvent. The patterned mask of photoresist 30 comprises at least one opening 33 in the photoresist 30. In the shown embodiment, two openings 33 are formed in photoresist 30.

Figure 7:
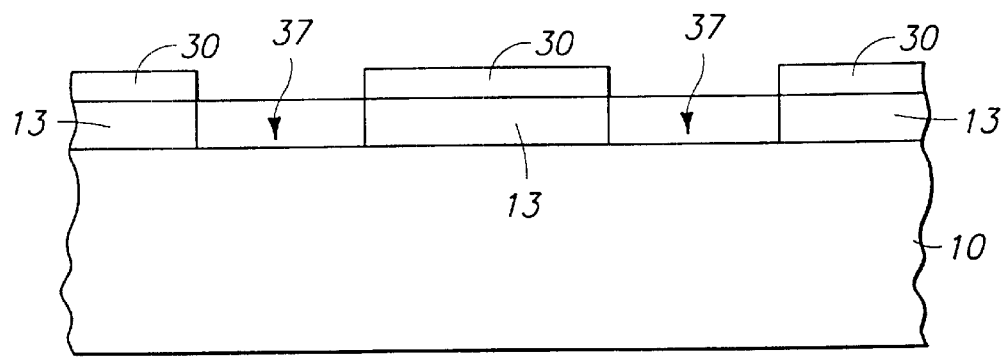
FIG. 7 is a view of the FIG. 1 substrate at a processing step subsequent to that shown in FIG. 6.

Referring to FIG. 7, the patterned photoresist material 30 is utilized as a mask for etching openings 37 into chrome containing layer 13 to form a pattern on the radiation patterning tool. An exemplary thickness for the radiation patterning tool is ¼ inch. Moreover, any pattern design desired in the radiation patterning tool can be formed by varying the location and number of openings 37 in chrome containing layer 13.

Referring to FIG. 8, a top view of the radiation patterning tool of FIG. 7 is shown with photoresist material 30 removed. Openings 37 are shown having a square periphery. However, alternatively, openings 37 could have any peripheral shape desired. The line 7—7 of FIG. 8 indicates the line along which the cross-sectional view of FIG. 7 is illustrated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A substrate spinning apparatus comprising:
   a substrate support having an upper surface configured for spinning a semiconductive substrate; and
   a plurality of extensions movable in an arc relative the substrate support, the arc formed within a plane generally perpendicular relative the upper surface of the substrate support, the extensions having a first orientation when the substrate support is stationary and a second orientation when the substrate support is spinning, the second orientation forming a recess to receive the semiconductive substrate.

2. The substrate spinning apparatus of claim 1 wherein the semiconductive substrate comprises an outer edge periphery, and wherein an entirety of the outer edge periphery is received within the recess surrounded by portions of the extensions.

3. The substrate spinning apparatus of claim 1 wherein the semiconductive substrate comprises an outer edge periphery, and wherein the recess is formed with a periphery substantially configured as the outer edge periphery of the semiconductive substrate.

4. The substrate spinning apparatus of claim 1 wherein the recess is formed by a portion of the substrate support and respective portions of the extensions.

5. The substrate spinning apparatus of claim 1 wherein the semiconductive substrate comprises a thickness, and wherein the recess is formed with a depth substantially equal to the thickness.

6. The substrate spinning apparatus of claim 1 wherein the semiconductive substrate comprises a non-circular outer-edge periphery, and wherein the recess is formed with a periphery substantially configured as the non-circular outer-edge periphery of the semiconductive substrate.

7. The substrate spinning apparatus of claim 1 wherein the plurality of the extensions comprise upper surfaces, and wherein the second orientation comprises the upper surfaces of the extensions positioned adjacent the upper surface of the substrate support to comprise a substantially coplanar and unitary upper surface.

8. The substrate spinning apparatus of claim 1 wherein the second orientation comprises the plurality of the extensions positioned adjacent the substrate support to comprise a substantially continuous outer edge periphery outwardly spaced from the semiconductive substrate, and wherein the outer edge periphery comprises substantially a circle.

9. A substrate spinning apparatus comprising:
   a substrate support having an upper surface configured for spinning a semiconductive substrate, the substrate support receiving the semiconductive substrate with portions of the semiconductive substrate extending laterally outward of the substrate support; and
   a plurality of extensions movable from a first position elevationally below the upper surface of the substrate support to a second position adjacent the upper surface of the substrate support for supporting the portions of the semiconductive substrate.

10. The substrate spinning apparatus of claim 9 wherein the semiconductive substrate comprises an outer edge periphery, and wherein the second position comprises the plurality of the extensions surrounding the outer edge periphery.

11. The substrate spinning apparatus of claim 10 wherein the outer edge periphery is non-circular.

12. The substrate spinning apparatus of claim 9 wherein the second position comprises the plurality of the extensions positioned adjacent the substrate support to comprise a recess to receive the semiconductive substrate.

13. The substrate spinning apparatus of claim 12 wherein the semiconductive substrate comprises a thickness, and wherein the recess is formed with a depth substantially equal to the thickness.

14. The substrate spinning apparatus of claim 9 wherein the second position comprises the plurality of the extensions positioned adjacent the semiconductive substrate during spinning.

15. The substrate spinning apparatus of claim 9 wherein the plurality of the extensions comprise upper surfaces, and the second position comprises the upper surfaces of the extensions positioned adjacent the upper surface of the substrate support to comprise a substantially coplanar and unitary upper surface.

16. The substrate spinning apparatus of claim 9 wherein the second position comprises the plurality of the extensions having an outer edge periphery outwardly spaced from the semiconductive substrate, and wherein the outer edge periphery comprises substantially a circle.

17. A substrate spinning apparatus comprising:
   a substrate support configured for spinning a semiconductive substrate, the substrate support comprising a portion of a recess; and
   a plurality of extensions movable relative the substrate support to form an entirety of the recess for receipt of the semiconductive substrate.

18. The substrate spinning apparatus of claim 17 wherein the semiconductive substrate comprises a thickness, and wherein the recess is formed with a depth substantially equal to the thickness.

19. The substrate spinning apparatus of claim 17 wherein the recess is formed with a non-circular periphery to correspond with a non-circular periphery of the semiconductive substrate.

20. The substrate spinning apparatus of claim 17 wherein the plurality of the extensions are configured to be positioned adjacent the substrate support to comprise a substantially coplanar upper surface, and wherein the upper surface is substantially coplanar with an upper surface of the semiconductive substrate.

\* \* \* \* \*